United States Patent
Chang et al.

(10) Patent No.: US 6,537,854 B1
(45) Date of Patent: Mar. 25, 2003

(54) METHOD FOR BONDING IC CHIPS HAVING MULTI-LAYERED BUMPS WITH CORRUGATED SURFACES AND DEVICES FORMED

(75) Inventors: Shyh-Ming Chang, Hsinchu (TW); Jwo-Huei Jou, Hsin-chu (TW); Chi-Yuan Wu, Hsinchu (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 09/317,307

(22) Filed: May 24, 1999

(51) Int. Cl.$^7$ ................. H01L 21/44; H01L 23/48
(52) U.S. Cl. ............... 438/118; 438/612; 438/613; 257/737; 257/778
(58) Field of Search ................. 438/118, 119, 438/612, 613, 614; 257/737, 738, 778

(56) References Cited

U.S. PATENT DOCUMENTS

| | | | |
|---|---|---|---|
| 5,393,697 A | * | 2/1995 | Chang et al. ............ 438/613 |
| 5,783,465 A | * | 7/1998 | Canning et al. .......... 438/118 |
| 5,789,278 A | * | 8/1998 | Akram et al. ............ 438/118 |
| 5,918,113 A | * | 6/1999 | Higashi et al. ........... 438/118 |
| 5,952,718 A | * | 9/1999 | Ohtsuka et al. .......... 257/778 |
| 6,084,301 A | * | 7/2000 | Chang et al. ............ 257/778 |

* cited by examiner

Primary Examiner—Kevin M. Picardat
(74) Attorney, Agent, or Firm—Tung & Associates

(57) ABSTRACT

A method for bonding an IC chip formed with corrugated, multi-layered bumps to conductive elements on a substrate and devices formed by such method are disclosed. In the method, multi-layered bumps are formed by a cover layer of a conductive metal deposited on a base layer of a compliant material. The exposed bonding surface of the bump is formed in a corrugated fashion, or in a serrated shape with saw-tooth configurations. The saw-tooth configurations may either be rectangular or triangular. In the bonding method, instead of using an anisotropic conductive film loaded with conductive particles, a solid adhesive film without conductive particles or a liquid adhesive material without conductive particles can be utilized. The serrated bonding surface of the bumps is effective in expelling the adhesive material from the bonding interface between the bumps and the conductive elements such that a low resistance bond can be formed between an IC chip and a substrate. The solid adhesive layer or the liquid adhesive material, after bonding and curing, functions effectively as a moisture barrier layer.

23 Claims, 5 Drawing Sheets

METHOD FOR BONDING IC CHIPS HAVING MULTI-LAYERED BUMPS WITH CORRUGATED SURFACES AND DEVICES FORMED

FIELD OF THE INVENTION

The present invention generally relates to a method for bonding an IC chip which has corrugated multi-layered bumps to a substrate and devices formed by the method and more particularly, relates to a method for bonding flip chips that are equipped with corrugated multi-layered bumps to a circuit board without using anisotropic conductive films and devices formed by the method.

BACKGROUND OF THE INVENTION

In recent years, liquid crystal display (LCD) panels have been used widely in place of cathode ray tubes (CRT) in electronic display applications. The LCD panel is first assembled together by filling a liquid crystal material inbetween a LCD substrate and a transparent glass cover plate. The LCD substrate consists of a multiplicity of switching, or electronic turn-on and turn-off devices for operating the multiplicity of pixels formed on the LCD panel.

After the assembly of a LCD panel is completed, the panel must be connected to an outside circuit for receiving electronic signals such that images may be produced in the panel. The electronic connections to the LCD panel can be provided by different techniques. A conventional technique for providing electronic signals to a LCD panel is by using a flexible printed circuit board (FPCB) which contains various electronic components welded thereto for providing signals to the LCD. The flexible printed circuit board is frequently manufactured of a conductive copper layer sandwiched between two flexible polyimide cover layers. The flexibility of FPCB is advantageous in the installation of a LCD panel. For instance, a conventional LCD panel may be connected by a FPCB to a printed circuit board (PCB) which has a surface mount technology (SMT) type IC chip mounted on top.

In another conventional technique for bonding a LCD to a PCB, a tape automated bonding (TAB) technique is used. In the TAB bonding technique, a TAB section is used to connect an LCD to a PCB. The TAB section consists of a TAB tape which has an IC chip connected to it through numerous bonding sites. The TAB bonding technique provides the benefit of a compact package so that circuit density can be improved resulting in a lead pitch as low as 60 μm. The TAB, also known as TCP (tape carrier package) utilizes finely patterned thin metal, i.e., copper foil plated with Au or Sn, in place of wires and connects the metal tips metallurgically to corresponding gold plated bumps that are formed on the aluminum pads on the chip. TAB is preferred in smaller-pitch interconnects for high I/O ULSI devices because it enables smaller pitch and longer span bondings than those available by wire bonding. However, the TAB bonding technique is normally conducted at a higher fabrication cost.

In still another technique for bonding a LCD to a PCB, as shown in FIGS. 1A and 1B, a chip on glass (COG) technique is used. In the COG technique, an IC chip 12 can be mounted directly to a glass substrate 14 of an LCD by utilizing solder bumps 16 and an anisotropic conductive film (ACF) 18. The ACF tape 18 contains electrically conductive particles 20 which are embedded in an insulative material 22. Positioned under the ACF 18 is the LCD substrate 14 which has conductive elements 24 formed on top. After the IC chip 12, the ACF 18 and the LCD substrate 14 are pressed together under heat, as shown in FIG. 1B, the conductive particles 20 provides electrical communication between the solder bumps 16 and the conductive elements 24 and therefore allowing the IC chip 12 to electrically communicate with the LCD substrate 14, i.e., the IC chip 12 may be a driver chip which is connected to the drive lines on the LCD. It should be noted that, electrical communication between the solder bumps 16 and the conductive elements 24 is only established where the conductive particles 20 are compressed, i.e., only established anisotropically and selectively. The conductive elements 24 on the LCD substrate 10 is normally formed of indium-tin-oxide (ITO) thin films.

The COG technique may further connect the LCD substrate 14 to a printed circuit board (not shown) or a flexible printed circuit board (not shown). The COG technique therefore relies on bonding with solder bumps 16 formed on an IC chip and the ACF 18 for electrical communications.

The traditional COG technique shown in FIGS. 1A and 1B may be carried out in an alternate method of using a liquid adhesive. This is shown in FIGS. 2A and 2B. In this alternate COG technique, an IC chip 12 is mounted directly to a glass substrate 14 of an LCD by solder bumps 16 and a liquid adhesive 26. The liquid adhesive 26 can be suitably an acrylic or an epoxy which can be cured by either an UV light or by heat. The liquid adhesive 26 can be dispensed in droplets such as shown in FIG. 2A on top of the glass substrate 14 over the conductive elements 24 formed on the substrate. The conductive elements 24 may be suitably formed of a conductive film such as ITO. After the liquid adhesive 26 is dispensed on the top surface 28 of the glass substrate 14, the IC chip 12 may be pressed onto the substrate 14 under a suitable pressure and heated to a suitable temperature. The pressure exerted enables the conductive elements 24 to intimately contact the solder bumps 16 such that an ohmic bond is formed thereinbetween. The liquid adhesive 26 fills the gap between the conductive elements 24 or the solder bumps 16 and solidifies after the curing process. The solidified liquid adhesive 26 functions as a stress buffer and a moisture barrier for protecting the bond formed between the conductive elements 24 and the solder bumps 16 from stress fracture or moisture attack. The bonded structure is shown in FIG. 2B.

As seen in the three conventional techniques for forming a TFT-LCD assembly, each of the techniques has its benefits and disadvantages. For instance, in the first technique of using SMT/FPCB, the circuit density can be increased to achieve a compact package at the expense of using difficult TAB technology and high material costs. In the TAB and COG method, a rework of the assembly such as the removal of a defective IC from a LCD substrate is extremely difficult, if not impossible. For instance, the only possible means for removing an IC chip that is bonded to a LCD substrate is by using a shear force for pushing an IC chip and breaking its bond with the LCD substrate. This is a difficult process and frequently results in the destruction of the entire assembly.

In the present fabrication process for TFT-LCD assemblies, the SMT/FPCB method is frequently used in fabricating lower priced assemblies such as those utilizing small LCD panels. In large LCD panel applications, i.e., such as those used in notebook computers, the TAB bonding method is normally used. The COG method, due to its difficulty in reworking and repair, is also limited to small LCD panel display applications. The TAB process and the COG process are therefore the two major assembling methods used for TFT-LCD assemblies. To sum up, the TAB method can be easily reworked and repaired by removing an IC chip from the TAB tape and furthermore, it is compact in size which allows the achievement of high density packages of up to 60 μm pitch. However, the TAB process requires complicated fabrication steps which include IC bonding, tape fabrication, inner lead bonding, encapsulation, outer lead bonding and the ACF process.

In the COG process shown in FIGS. 1A and 1B, the ACF film 18 used presents numerous problems. First, the cost of the ACF films is high compared to other underfill or stress buffer materials. The high cost is contributed by the gold coating required on the conductive particles or fillers and the epoxy material used in the medium. Secondly, in modem high density circuit designs where the pitch between bumps may be smaller than 50 μm, the problem of voltage leaks or shorts frequently occurs. Thirdly, due to the presence of electrically conductive particles in the filler material that are trapped between the solder bumps, signal interference frequently occurs such that the IC/substrate assembly cannot be used in high frequency applications.

The COG technique utilizing a liquid adhesive shown in FIGS. 2A and 2B also has numerous processing and performance difficulties. For instance, due to the large surface area of the contact surface of the solder bump, it is difficult to exclude all the liquid adhesive at the interface between the solder bump and the conductive element on the substrate. In order to ensure a clean interface, the viscosity of the liquid adhesive utilized must be controlled at between about 1,000 and about 2,000 cps. When the viscosity of the liquid adhesive is higher than 2,000 cps, the exclusion of the adhesive from the interface becomes difficult which contributes to excessively high resistance or even insulation at the interface after the bonding process is completed. Furthermore, the large surface area on the contact surface of the bump requires a large contact force to be exerted on the bump in order to form a bond between the bump and the conductive element on the substrate. The larger the contact force utilized, the larger the bounce-back force on the bump and the conductive elements which may cause a defective bond formed. Moreover, the large contact force used requires the use of a high strength and high Young's modules liquid adhesive which causes other processing difficulties.

It is therefore an object of the present invention to provide a method for bonding an IC chip equipped with solder bumps to conductive elements on a substrate that does not have the drawbacks and shortcomings of the conventional bonding methods.

It is another object of the present invention to provide a method for bonding an IC chip equipped with solder bumps to conductive elements on a substrate that does not require the use of an anisotropic conductive film thereinbetween.

It is a further object of the present invention to provide a method for bonding an IC chip equipped with solder bumps to conductive elements on a substrate that does not require the use of an liquid adhesive as an underfill material thereinbetween.

It is another further object of the present invention to provide a method for bonding an IC chip equipped with solder bumps to conductive elements on a substrate wherein the bumps are formed in a multi-layer structure.

It is still another object of the present invention to provide a method for bonding an IC chip equipped with solder bumps to conductive elements on a substrate wherein the solder bumps are formed by a compliant material coated with an electrically conductive metal.

It is yet another object of the present invention to provide a method for bonding an IC chip equipped with solder bumps to conductive elements on a substrate wherein the bumps are formed in a multi-layered structure having a corrugated contact surface.

It is still another further object of the present invention to provide an IC chip that has corrugated multi-layered bumps on top wherein the multi-layered bumps are formed by a base layer of a compliant material and a cover layer of an electrically conductive metal having a serrated contact surface.

It is yet another further object of the present invention to provide a flip chip/printed circuit board assembly wherein the flip chip is equipped with multi-layered solder bumps that have corrugated contact surface for bonding to conductive pads on the printed circuit board without using an anisotropic conductive film or a liquid adhesive thereinbetween.

SUMMARY OF THE INVENTION

In accordance with the present invention, a method for bonding an IC chip that has corrugated multi-layered bumps to conductive elements on a substrate and devices formed by the method are provided.

In a preferred embodiment, a method for bonding an IC chip that has corrugated multi-layered bumps to a substrate can be carried out by the steps of providing an IC chip that has an active surface equipped with multi-layered bumps, the multi-layered bumps include a base layer which is formed of a compliant material and a cover layer which is formed of a conductive metal, the cover layer is in electrical communication with input/output pads on which the bumps are built, the multi-layered bumps are formed in a corrugated shape with outwardly protruding chips, providing a substrate that has a top surface equipped with conductive elements that are positioned corresponding to the bumps on the IC chip, positioning an electrically insulative, stress-buffering material between the conductive elements and the bumps, and compressing and heating the IC chip and the substrate together with the bumps contacting the conductive elements through the electrically insulative, stress-buffering material until electrical communication between the outwardly protruding chips on the bumps and the conductive elements are established.

The method for bonding an IC chip that has corrugated multi-layered bumps to a substrate may further include the step of positioning an adhesive film layer as the electrically insulative, stress-buffering material between the flip chip and the substrate to effect bonding. The method may further include the step of depositing a liquid adhesive on the substrate as the electrically insulative, stress-buffering material prior to the flip chip and substrate bonding step. The adhesive film layer may be formed of a material selected from epoxy, acrylic and polyimide. The liquid adhesive deposited may be a material selected from acrylic and epoxy. The method may further include the step of forming the multi-layered bumps in a rectangular saw-tooth shape, or in a triangular saw-tooth shape.

The method for bonding an adhesive chip to a substrate may further include the step of forming the base layer in an electrically insulating material, or in a polymeric material, or in polyimide. The method may further include the step of forming the cover layer with at least one metal of high electrical conductivity, or forming the cover layer with at least one metal selected from the group including Al, Ni, TiW and Au, or with an Al base coating and a Au top coating. The method may further include the step of forming the base layer and the cover layer by at least two photolithographic processes. The IC chip may be a flip chip and the substrate may be a printed circuit board, a glass substrate for LCD or a ceramic substrate for a multi-chip module.

The present invention is further directed to an IC chip that has corrugated multi-layered bumps on top which includes an active surface on the IC chip formed with conductive pads and a corrugated multi-layered bump on each of the conductive pads, the multi-layered bump includes a base layer of a compliant material and a cover layer of an electrically conductive metal formed in a corrugated shape with outwardly protruding tips.

In the IC chip that has corrugated multi-layered bumps, the corrugated multi-layered bump may be formed in a rectangular saw-tooth shape or in a triangular saw-tooth shape. The base layer in the corrugated multi-layered bump may be formed of a polymeric material. The cover layer in the corrugated multi-layered bump may be formed of at least one metal selected from the group including Al, Ni, Ti, In, Sn, W, Pt, Pd, Cu, Cr, Ag and Au. The cover layer in the corrugated multi-layered bump may be formed of a stack of Al, TiW and Au with Au on top, or a layer of Al, Ti, W, Pt, Pd, Cu, Cr, Ag with a Au layer on top.

The present invention is still further directed to a flip chip/printed circuit board (PCB) assembly that includes an IC chip which has an active surface and a first multiplicity of conductive pads on the active surface, a corrugated multi-layered bump in each of the first multiplicity of conductive pads including a base layer of a compliant material and a cover layer of an electrically conductive metal formed with outwardly protruding tips, a layer of compliant material filling gaps formed between the multi-layered bumps, the active surface of the IC chip and the top surface of the PCB, and a PCB which has a second multiplicity of conductive traces formed on a top surface, the top surface of the PCB being positioned juxtaposed to the active surface of the IC chip with the compliant material therein-between and the second multiplicity of conductive traces in electrical communication with the first multiplicity of conductive pads through the corrugated multi-layered bumps.

In the flip chip/printed circuit board assembly, the base layer in the corrugated multi-layered bump may be formed of a polymeric material, the cover layer may be formed by a Au layer on top of an Al layer. The outwardly protruding tips may be formed in a rectangular or in a triangular shape when viewed in a side view. The compliant material layer may be formed of a polymeric material, or may be formed of a material selected from the group including acrylic, epoxy and polyimide.

BRIEF DESCRIPTION OF THE DRAWINGS

These objects, features and advantages will become apparent from a close examination of the following specification and the appended drawings in which.

DETAILED DESCRIPTION OF THE PREFERRED AND ALTERNATE EMBODIMENTS

The present invention provides a method for bonding an IC chip that is equipped with corrugated, multi-layered bumps to conductive elements on a substrate and devices formed by such method. In the method, an IC chip is provided which has an active surface built with corrugated multi-layered bumps constructed by a base layer of a compliant material and a cover layer of a conductive metal. The cover layer of the bumps is in electrical communication with an input/output pad the bump is built on. The corrugated multi-layered bump is formed with a corrugated surface which has outwardly protruding tips for making contact with conductive elements on a substrate.

Instead of utilizing an anisotropic conductive film layer for providing electrical communication between bumps on an IC chip and conductive elements on a substrate, a solid adhesive film or a liquid adhesive material is utilized. The corrugated bonding surface of a bump penetrates the solid adhesive film or the liquid adhesive layer to make an ohmic contact with a conductive element on the substrate establishing electrical communication. The performance and processing difficulties caused by the conductive particles in the anisotropic conductive film can be eliminated by the present invention novel method. Furthermore, the solid adhesive film or the liquid adhesive material can be utilized at a substantially lower cost than the ACF films. Since there are no conductive particles in the solid adhesive film and there is no chance for causing a short, a higher circuit density utilizing a pitch smaller than 50 μm can be realized. Furthermore, the IC chip/substrate package can be utilized in high frequency applications since there are no conductive particles for causing radio frequency interferences.

The present invention novel method utilizes corrugated, multi-layered bumps for establishing an ohmic contact with conductive elements on a substrate. The corrugated bonding surface can be formed either in a rectangular or in a triangular saw-tooth shape. The protruding sharp points on the saw-tooth configuration is capable of penetrating either the solid adhesive film or the liquid adhesive layer for making electrical contact with the conductive elements on the substrate. The present invention novel method therefore allows the use of higher viscosity liquid adhesive materials. Moreover, since the contact force required is substantially smaller, the Young's modules of the material for building the bumps need not be low. Similarly, there is no need for high bonding strength materials.

Figure 1A:
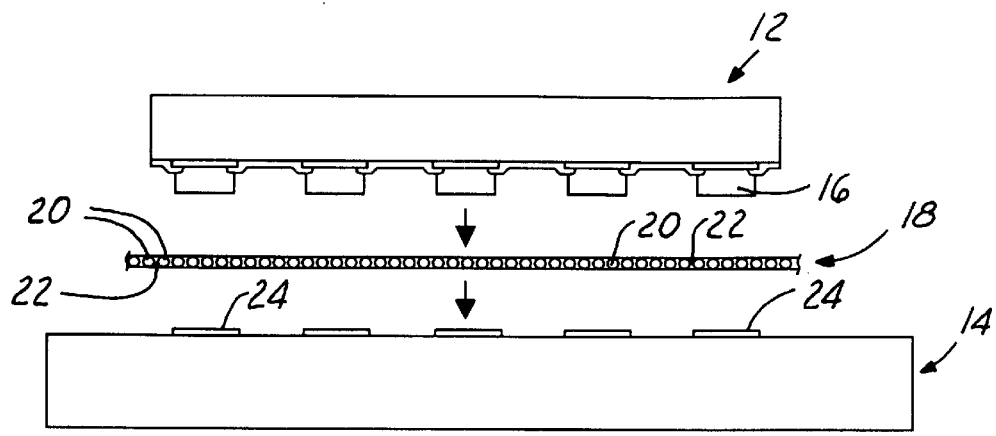
FIG. 1A is an enlarged, cross-sectional view of a conventional method of bonding an IC chip to a glass substrate with an anisotropic conductive film thereinbetween.
Figure 1B:
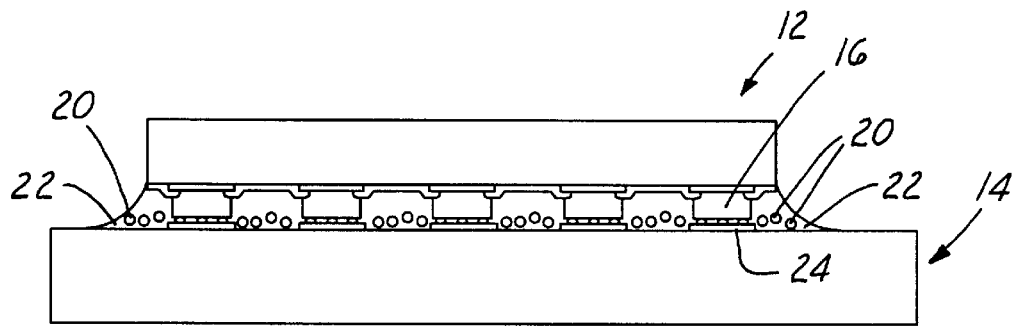
FIG. 1B is an enlarged, cross-sectional view of the conventional method shown in FIG. 1A after the IC chip and the glass substrate are bonded together.
Figure 2A:
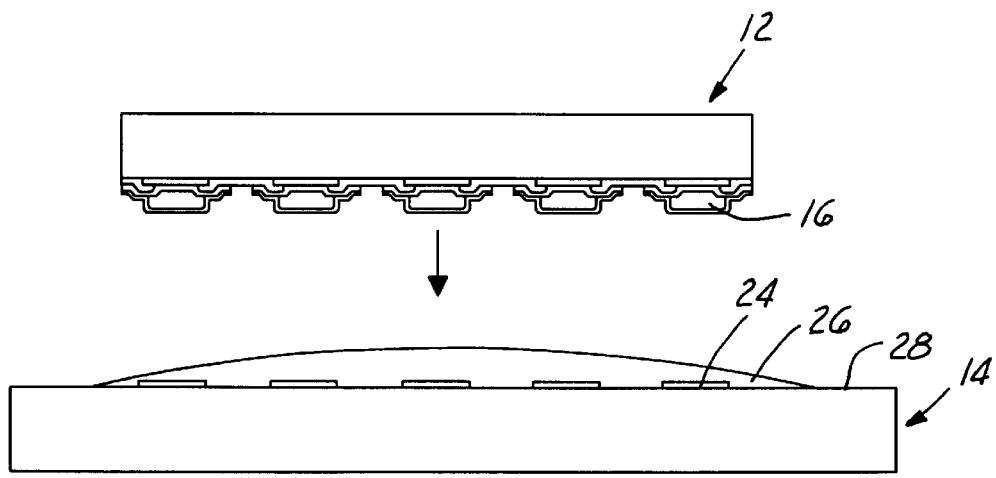
FIG. 2A is an enlarged, cross-sectional view of a conventional method of bonding an IC chip to a glass substrate by a liquid adhesive.
Figure 2B:
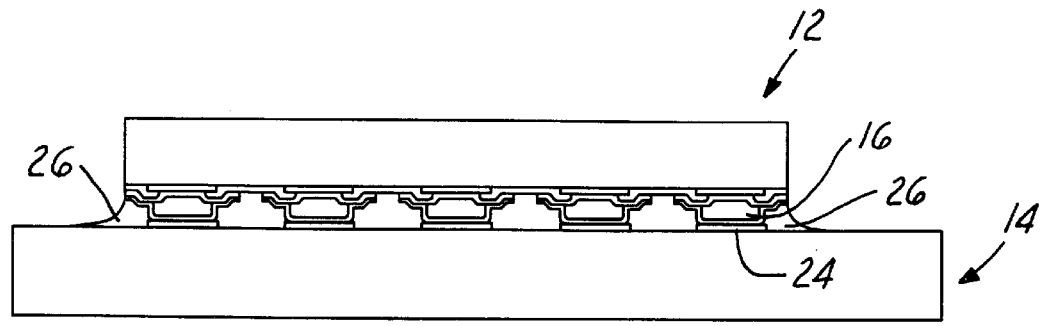
FIG. 2B is an enlarged, cross-sectional view of the conventional method shown in FIG. 2A after the IC chip and the glass substrate are bonded together.
Figure 3A:
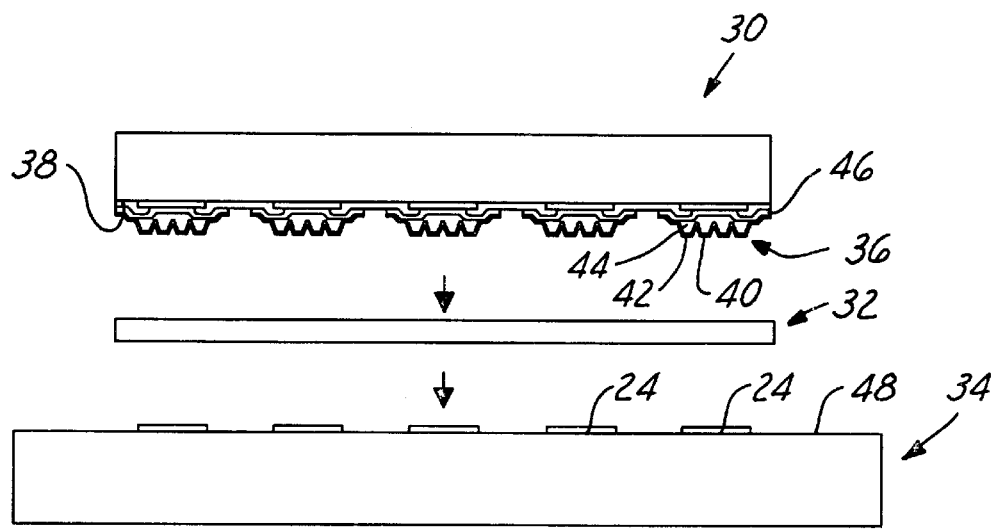
FIG. 3A is an enlarged, cross-sectional view of a first embodiment of the present invention for bonding an IC chip with corrugated, multi-layered bumps to a glass substrate by an adhesive film.

Referring now to FIG. 3A wherein a first embodiment of the present invention novel bonding method is shown. FIG. 3A is an enlarged, cross-sectional view of a first embodiment of the present invention illustrating an IC chip 30, a solid adhesive film 32 and a substrate 34 prior to a bonding process. The IC chip 30 is equipped with a multiplicity of bumps 36 in a top surface 38 of the chip. The bumps 36 are formed with a corrugated bonding surface 40 in a multi-layered structure. The multi-layered bump, or a composite bump is formed by a cover layer 42 and a base layer 44. The cover layer 42 is normally formed of a metal which has high electrical conductivity, for instance, an aluminum layer coated with a gold coating. The base layer 44 is formed of a compliant material such as a polymeric material so that the bonding stress occurred during the compression of the IC chip 30 against the glass substrate 34 with a contact stress acting in the bonded structure. A suitable base material is a polyimide.

Figure 3B:
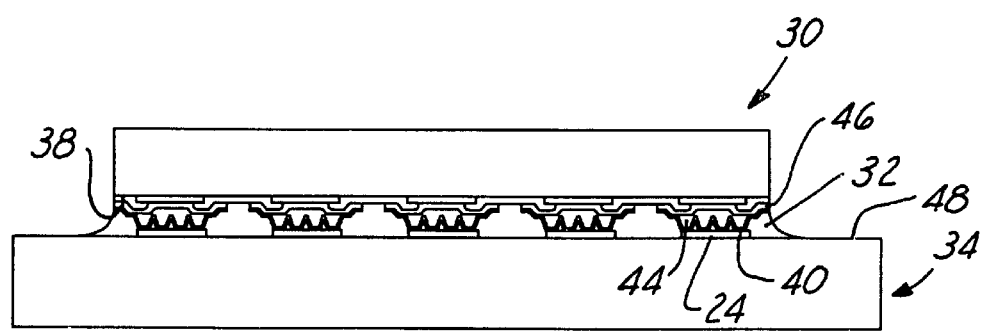
FIG. 3B is an enlarged, cross-sectional view of the present invention first embodiment method shown in FIG. 3A after the IC chip and the glass substrate are bonded together.

The corrugated bonding surface 40 of the bumps 36 shown in FIGS. 3A and 3B is provided in a serrated shape or in a saw-tooth shape. The special shape of the bonding surface 40 of the bump 36 is important since it is capable of cutting through a solid adhesive film 32 under pressure and heat during a bonding process such that the cover layer 42, i.e., the conductive metal layer which is in electrical communication with the BLM layer 46 on the bump 36 can make the necessary electrical connection with the conductive elements 24 provided on the top surface 48 of the glass substrate 34.

The solid adhesive layer 32 may be suitably provided in a material such as epoxy, acrylic, polyimide or any other suitable materials. A suitable thickness of the solid adhesive layer is between about 10 μm and about 35 μm, and preferably between about 15 μm and about 30 μm. The adhesive layer 32 should be made of a low strength material such that it can be easily penetrated by the serrated edge of the bonding surface of the bump. A suitable bonding temperature is between about 180° C. and about 220° C. After the bonding operation is completed, as shown in FIG. 3B, the bonded device can be cured by heat or under UV radiation in a temperature range of 150° C.~190° C. such that the adhesive layer 32 may provide stress-buffering and moisture sealing functions for the bonded device. It should be noted that the base layer material for the bump, i.e., a polyimide and the adhesive film layer material, i.e., acrylic or epoxy, should have similar coefficients of thermal expansion and Young's modules such that they are CTE matched without causing thermal shock problem and Young's modules matched without causing bond stress problem.

The serrated surface 40 of the bump 36 shown in FIG. 3A may be suitably formed by at least two separate photolithographic processes and at least two photomasks. For instance, in the first photolithographic process, a smooth-top bump may be formed on the surface of the BLM layer 46. A second photolithographic process is then used to form the serrated edge on the bonding surface 40 of the bump 36. Any other suitable processing methods may also be used to form the present invention novel corrugated, multi-layered bump structure.

Figure 4A:
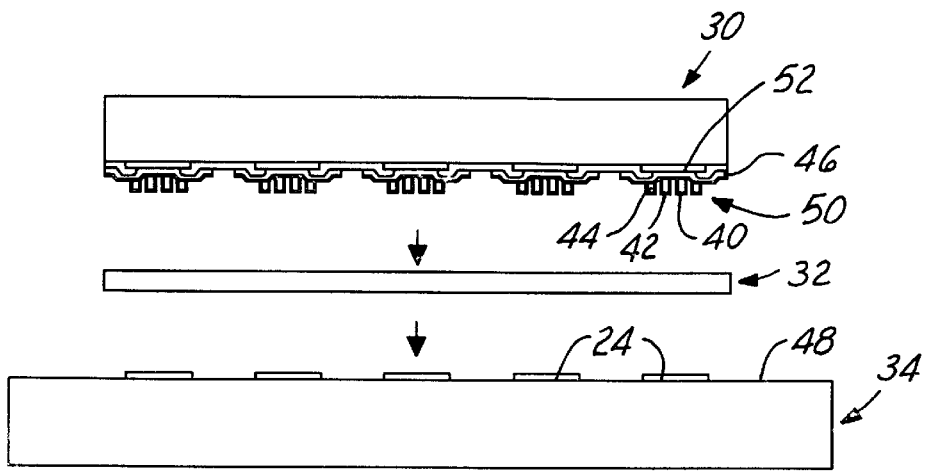
FIG. 4A is an enlarged, cross-sectional view of a second embodiment of the present invention method for bonding an IC chip with corrugated, multi-layered bumps to a glass substrate by using a solid adhesive film.
Figure 4B:
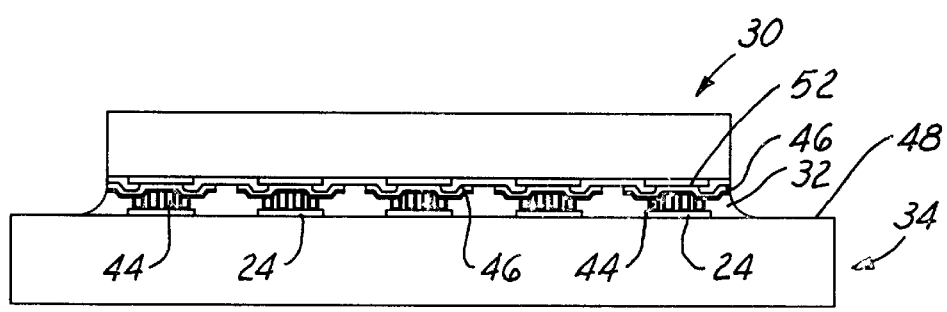
FIG. 4B is an enlarged, cross-sectional view of the second embodiment of the present invention method shown in FIG. 4A after the IC chip and the glass substrate are bonded together.

A second preferred embodiment of the present invention is shown in FIGS. 4A and 4B in enlarged, cross-sectional views. In this second preferred embodiment, the bumps 50 are formed in a different pattern than that shown in the first preferred embodiment of FIG. 3A. For instance, instead of a serrated top bonding surface 40, the solder bump 50 is formed with completely separated individual regions shaped in columns. Each of the individual columns is formed, similar to that of the first preferred embodiment, with a cover layer 42 of a conductive metal and a compliant material base layer 44. The bonding surface 40 therefore has similar, or improved penetration capability than that shown in the first preferred embodiment in FIG. 3A for penetrating a solid adhesive layer 32 such that an ohmic contact with the conductive elements 24 on the substrate 34 can be established. It should be noted that, either in the first or in the second preferred embodiment, only a contact joint is formed between the gold coated bumps and the conductive elements on the glass substrate. There are no solder joint or any other joint involved which requires the melting of the joining material. Similar to that shown for the first preferred embodiment, the cover layer 42 of the bump 50 is in electrical communication with the base BLM layer 46, and in turn with the bonding pad 52.

Figure 5A:
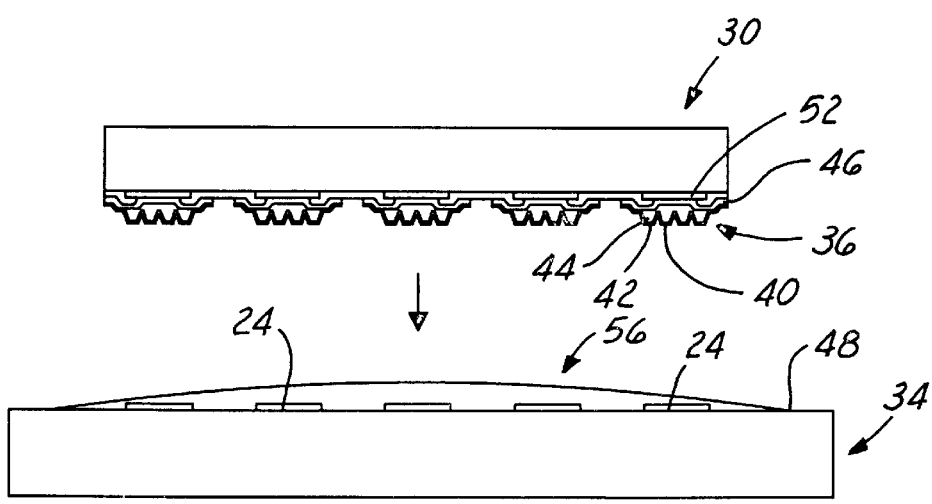
FIG. 5A is an enlarged, cross-sectional view of the third embodiment of the present invention method for bonding an IC chip equipped with corrugated, multi-layered bumps to a glass substrate by using a liquid adhesive.
Figure 5B:
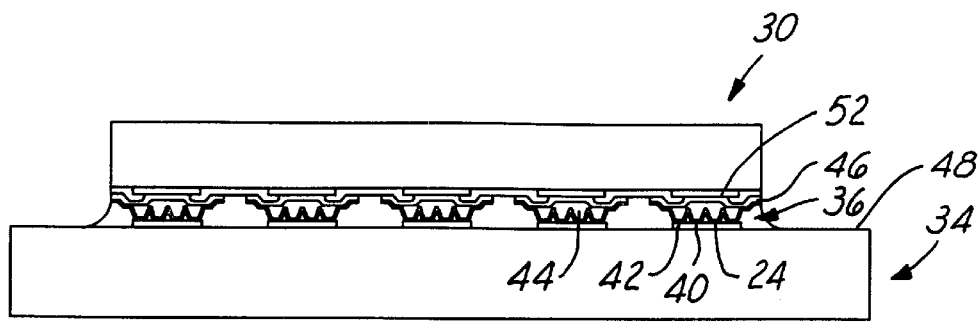
FIG. 5B is an enlarged, cross-sectional view of the third embodiment of the present invention method shown in FIG. 5A after the IC chip and the substrate are bonded together.

A third preferred embodiment of the present invention bonding method is shown in FIGS. 5A and 5B. It is to be noted that in the enlarged, cross-sectional views, bumps 36 that are similar to that formed in the first preferred embodiment of FIG. 3A are utilized. In this third preferred embodiment, instead of the solid adhesive film 32 utilized in the first two preferred embodiments, a droplet 56 of a liquid adhesive material is used. As shown in FIG. 5A, the droplet 56 of the liquid adhesive material covers the conductive elements 24 formed on the top surface 48 of the glass substrate 34. The serrated edge in the bonding surface 40 of the bump 36 is capable of penetrating the liquid adhesive 56 to make ohmic contact with the conductive elements 24 on the glass substrate 34. This is shown in FIG. 5B. The liquid adhesive material 56 utilized may be UV curable or thermal curable. A suitable liquid adhesive material is acrylic. The viscosity should be in the range between about 5 cps and about 20,000 cps such that the liquid adhesive can be easily pushed away by the serrated edge of the bonding surface on the bump during the bonding process with the conductive elements on the substrate.

Figure 6A:
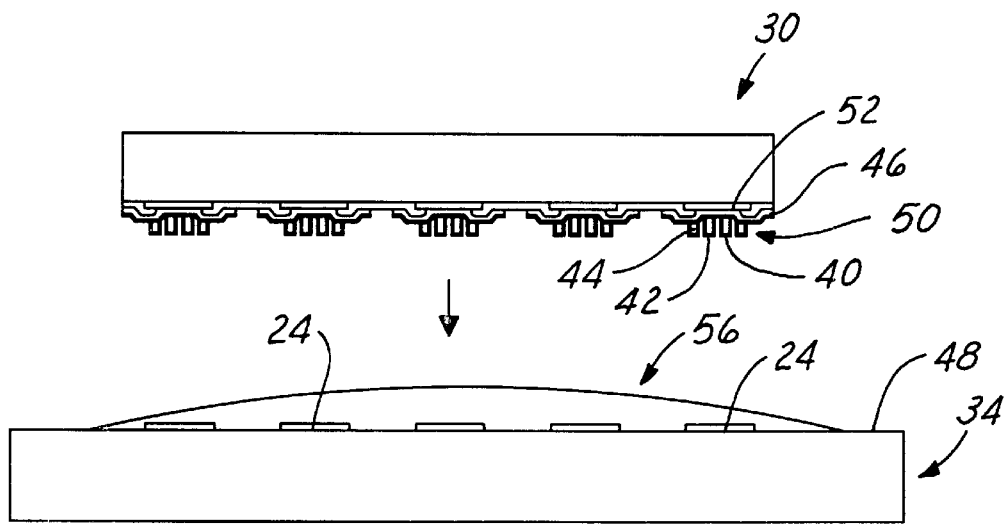
FIG. 6A is an enlarged, cross-sectional view of a fourth embodiment of the present invention method for bonding an IC chip equipped with corrugated, multi-layered bumps to a glass substrate by using a liquid adhesive.
Figure 6B:
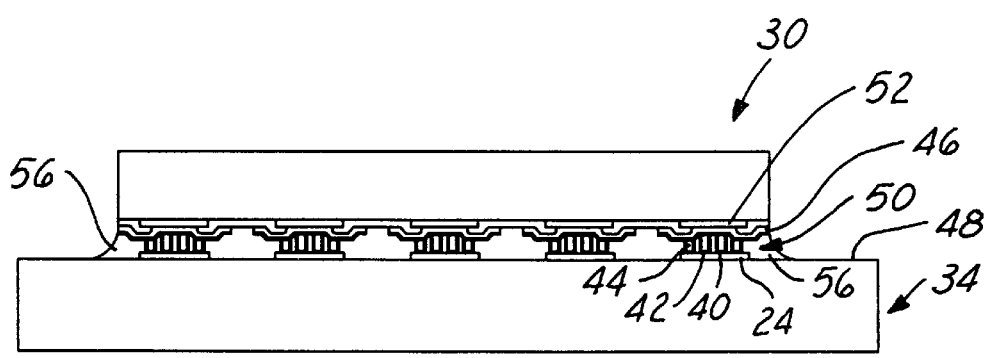
FIG. 6B is an enlarged, cross-sectional view of the fourth embodiment of the present invention method shown in FIG. 6A after the IC chip and the glass substrate are bonded together.

In another application utilizing liquid adhesive, as shown in the present invention fourth preferred embodiment in FIGS. 6A and 6B, an IC chip 30 equipped with bumps 50 similar to that in the second preferred embodiment are used. The difference being that instead of the solid adhesive layer 32 (shown in FIG. 4A), a droplet 56 of a liquid adhesive is dispensed on the top surface 48 of the glass substrate 34. The serrated bonding surface 40 of the bump 50 is formed in separate columns each having a cover layer 42 of a conductive metal and a base layer 44 of a compliant material. The formation of the serrated bump 50 is similar to that shown in the second preferred embodiment of FIG. 4A. The serrated bonding surface 40 can be advantageously used to separate and push away the liquid adhesive material 56 during the bonding process when the IC chip 30 is compressed against the glass substrate 34 such that electrical communication between the bump 50 and the conductive element 24 can be established. It should be noted that the liquid adhesive material 56, after curing either by UV light or by heat, forms an underfill layer between the IC chip 30 and the glass substrate 34 for both stress-buffering and moisture-sealing functions. This is shown in FIG. 6B.

Figure 7A:
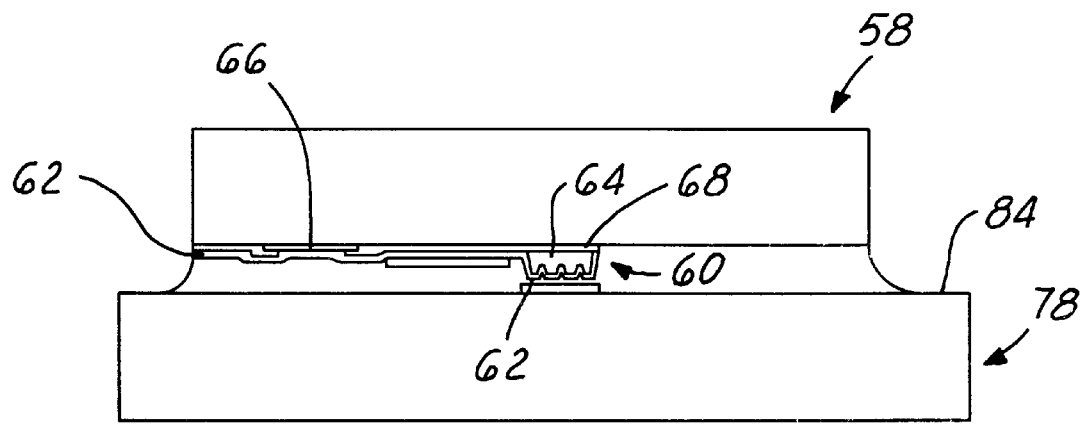
FIG. 7A is an enlarged, cross-sectional view of a first implementation example of the present invention method.
Figure 7B:
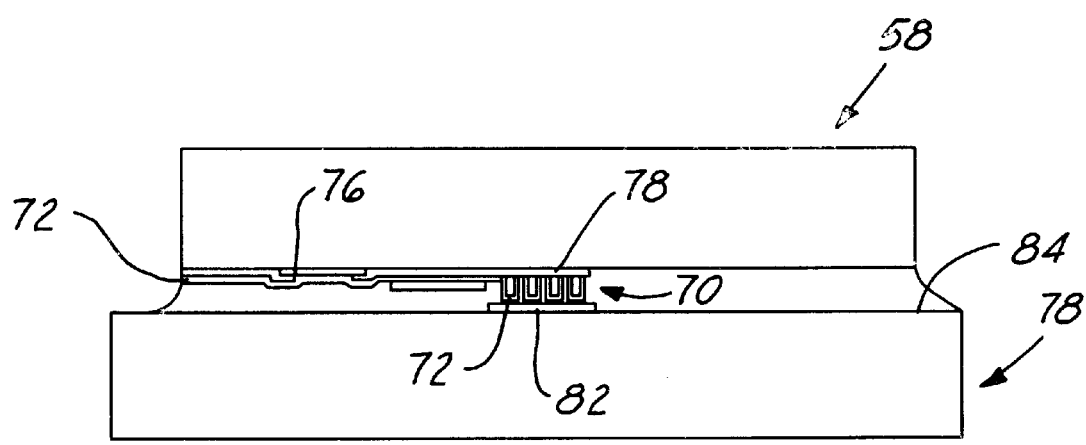
FIG. 7B is an enlarged, cross-sectional view of a second implementation example of the present invention method.

Two implementation examples utilizing the present invention novel method are shown in FIGS. 7A and 7B. Both implementation examples illustrate the use of the present invention novel method in an I/O redistribution process, i.e., extending a bond pad in a peripheral array to a bond pad in an area array. FIG. 7A shows a new bump 60 is formed in the area array, i.e., near the center region of the IC chip 58 in a multi-layered structure. The multi-layered structure consists of a conductive metal cover layer 62 and a compliant material base layer 64. It is seen that the conductive metal layer 62 is utilized as a metal trace for extending the bond pad 66 located in a peripheral array to a bond pad 68 located in an area array.

FIG. 7B shows a second implementation example of the present invention novel method in which a bump 70 is formed on the surface of the IC chip 58. The bump 70 is similar to that shown in the second and fourth preferred embodiment of the present invention method previously. Similar to the example shown in FIG. 7A, a cover layer of conductive material 72 is utilized to extend a bond pad 76 from a peripheral array to a bond pad 78 in an area array. An I/O redistribution is thus accomplished. The bump 70 is bonded to a conductive element 82 formed on a top surface 84 of a glass substrate 78.

The present invention novel method for forming corrugated, multi-layered bumps on the surface of an IC chip for bonding to conductive elements on a substrate and devices formed by such method have therefore been amply described in the above descriptions and in the appended drawings of FIGS. 3A~7B.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

1. A method for bonding an IC chip having corrugated multi-layered bumps to a substrate comprising the steps of:
   providing an IC chip having an active surface equipped with multi-layered bumps, said multi-layered bumps comprising a base layer formed of a compliant material and a cover layer formed of a conductive metal, said cover layer being in electrical communication with input/output pads onto which said bumps are built, said multi-layered bumps being formed in a corrugated shape with outwardly protruding tips,
   providing a substrate having a top surface equipped with conductive elements positioned corresponds to said bumps on said IC chip,
   positioning a solid sheet of an electrically insulative material between said conductive elements and said bumps, and
   compressing and heating said IC chip and said substrate together with said bumps contacting said conductive elements through said electrically insulative material until electrical communication between said outwardly protruding tips on said bumps and said conductive elements is established.

2. A method for bonding an IC chips having corrugated multi-layered bumps to a substrate according to claim 1 further comprising the step of positioning an adhesive film layer as said electrically insulative material between said IC chip and said substrate to effect bonding.

3. A method for bonding a IC chip having corrugated multi-layered bumps to a substrate according to claim 2, wherein said adhesive film layer is formed of a material selected from the group consisting of epoxy, acrylic and polyimide.

4. A method for bonding an IC chip having corrugated multi-layered bumps to a substrate according to claim 1 further comprising the step of forming said multi-layered bumps in a rectangular saw-tooth shape.

5. A method for bonding an IC chip having corrugated multi-layered bumps to a substrate according to claim 1 further comprising the step of forming said multi-layer bumps in a triangular saw-tooth shape.

6. A method for bonding an IC chip having corrugated multi-layered bumps to a substrate according to claim 1 further comprising the step of forming said base layer in an electrically insulating material.

7. A method for bonding an IC chip having corrugated multi-layered bumps to a substrate according to claim 1 further comprising the step of forming said base layer in a polymeric material.

8. A method for bonding an IC chip having corrugated multi-layered bumps to a substrate according to claim 1 further comprising the step of forming said base layer in polyimide.

9. A method for bonding an IC chip having corrugated multi-layered bumps to a substrate according to claim 1 further comprising the step of forming said cover layer with at least one metal of high electrical conductivity.

10. A method for bonding an IC chip having corrugated multi-layered bumps to a substrate according to claim 1 further comprising the step of forming said cover layer with at last one metal selected from the group consisting of Al, Ni, Ti, In, Sn, W, Pt, Pd, Cu, Cr, Ag and Au.

11. A method for bonding an IC chip having corrugated multi-layered bumps to a substrate according to claim 1 further comprising the step of forming said cover layer with an Al base coating and a Au top coating.

12. A method for bonding an IC chip having corrugated multi-layered bumps to a substrate according to claim 1 further comprising the step of forming said base layer and said cover layer by at least two photolithographic processes.

13. A method for bonding an IC chip having corrugated multi-layered bumps to a substrate according to claim 1, wherein said IC chip is a flip chip and said substrate is a printed circuit board (PCB).

14. An IC chip having corrugated multi-layered bumps on top comprising:
   an active surface on said IC chip formed with conductive pads, and
   a corrugated multi-layer bump on each of said conductive pads, said multi-layered bump comprises a base layer of a compliant material and a cover layer of an electrically conductive metal formed in a corrugated shape with outwardly protruding tips, said corrugated multi-layer bump being formed in a rectangular saw-tooth shape.

15. An IC chip having corrugated multi-layer bumps on top according to claim 14, wherein said base layer in said corrugated multi-layer bump being formed of a polymeric material.

16. An IC chip having corrugated multi-layer bumps on top according to claim 14, wherein said cover layer in said corrugated multi-layer bump being formed of at least one metal selected from the group consisting of Al, Ni, Ti, In, Sn, W, Pt, Pd, Cu, Cr, Ag and Au.

17. An IC chip having corrugated multi-layer bumps on top according to claim 14, wherein said cover layer in said corrugated multi-layer bump being formed of a stack of Al, TiW and Au with Au on top.

18. A flip chip/printed circuit board (PCB) assembly comprising:

an IC chip having an active surface and a first multiplicity of conductive pads on said active surface, a corrugated multi-layer bump on each of said first multiplicity of conductive pads comprising a base layer of a compliant material and a cover layer of an electrically conductive metal formed with outwardly protruding tips, a layer of insulating material filling gaps formed between said multi-layer bumps, said active surface of the IC chip and said top surface of the PCB, and a PCB having a second multiplicity of conductive traces formed on a top surface, said top surface of the PCB being positioned juxtaposed to said active surface of the IC chip with said insulating material thereinbetween and said second multiplicity of conductive traces in electrical communication with said first multiplicity of conductive pads through said corrugated multi-layer bumps.

19. A flip chip/PCB assembly according to claim 18, wherein said base layer in said corrugated multi-layer bump being formed of a polymeric material.

20. A flip chip/PCB assembly according to claim 18, wherein said cover layer in said corrugated multi-layer bump being formed by a Au layer on top of an Al layer.

21. A flip chip/PCB assembly according to claim 18, wherein said outwardly protruding tips are formed in rectangular or triangular shapes when viewed in a side view.

22. A flip chip/PCB assembly according to claim 18, wherein said compliant material layer being formed of a polymeric material.

23. A flip chip/PCB assembly according to claim 18, wherein said compliant material layer being formed of a material selected from the group consisting of acrylic, epoxy and polyimide.

\* \* \* \* \*